US012391023B2

(12) United States Patent
Cai

(10) Patent No.: US 12,391,023 B2
(45) Date of Patent: Aug. 19, 2025

(54) ELECTRONIC DEVICE, ROTATING SHAFT, LAMINATED COMPOSITE MATERIAL, AND METHOD FOR MANUFACTURING LAMINATED COMPOSITE MATERIAL

(71) Applicant: HUAWEI TECHNOLOGIES CO., LTD., Guangdong (CN)

(72) Inventor: Ming Cai, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 279 days.

(21) Appl. No.: 18/173,881

(22) Filed: Feb. 24, 2023

(65) Prior Publication Data

US 2023/0202139 A1   Jun. 29, 2023

Related U.S. Application Data

(63) Continuation of application No. PCT/CN2021/095317, filed on May 21, 2021.

(30) Foreign Application Priority Data

Aug. 25, 2020   (CN) .................. 202010864702.X

(51) Int. Cl.
   B32B 15/01   (2006.01)
   B32B 7/12   (2006.01)
   (Continued)

(52) U.S. Cl.
   CPC .............. B32B 15/011 (2013.01); B32B 7/12 (2013.01); B32B 15/18 (2013.01); B32B 15/20 (2013.01);
   (Continued)

(58) Field of Classification Search
   None
   See application file for complete search history.

(56) References Cited

U.S. PATENT DOCUMENTS

2007/0009731 A1* 1/2007 Dumm ................ C03B 9/48
                                                          427/446
2007/0029114 A1   2/2007 Middlemiss
                        (Continued)

FOREIGN PATENT DOCUMENTS

CN   201866083 U   6/2011
CN   102174877 A   9/2011
                    (Continued)

OTHER PUBLICATIONS

Matweb, "Molybdenum", accessed Jan. 22, 2025, <https://www.matweb.com/search/datasheet.aspx?matguid=a6039ca64ad74598aadf05c9e2f6c1a4>.*
Matweb, "Copper", accessed Jan. 22, 2025, <https://www.matweb.com/search/datasheet_print.aspx?matguid=9aebe83845c04c1db5126fada6f76f7e>.*
Li et al., "Simultaneously enhanced electro-mechanical properties of CNTs/Cu-20wt.%Mo composite material by regulating interface with Mo2C nanoparticles", Diamond & Related Materials, vol. 147 (2024) 111315. (Year: 2024).*
(Continued)

*Primary Examiner* — Xiaobei Wang

(57) ABSTRACT

Embodiments of this application provide an electronic device, a rotating shaft, a laminated composite material, and a method for manufacturing a laminated composite material. The laminated composite material includes at least two material layers that form the laminated composite material, and the at least two material layers include a first material layer and a second material layer adjacent to each other. The first material layer uses a first metal material, yield strength of the first metal material is greater than 200 Mpa, and an elongation rate of the first metal material is greater than 6%. The second material layer uses a first composite material, and the first composite material includes a second metal material and diamond particles. In this way, heat conduction performance and heat dissipation performance of the rotating shaft are improved while fracture-resistant performance and wear-resistant performance of the rotating shaft are ensured, thereby improving user experience.

17 Claims, 5 Drawing Sheets

(51) Int. Cl.
  *B32B 15/18* (2006.01)
  *B32B 15/20* (2006.01)
  *B32B 37/12* (2006.01)

(52) U.S. Cl.
  CPC .... *B32B 37/1284* (2013.01); *B32B 2264/108* (2013.01); *B32B 2305/30* (2013.01); *B32B 2307/54* (2013.01); *B32B 2457/00* (2013.01); *Y10T 428/12535* (2015.01); *Y10T 428/12549* (2015.01); *Y10T 428/12625* (2015.01); *Y10T 428/12903* (2015.01); *Y10T 428/1291* (2015.01); *Y10T 428/12951* (2015.01); *Y10T 428/12958* (2015.01); *Y10T 428/12965* (2015.01); *Y10T 428/12972* (2015.01); *Y10T 428/12979* (2015.01)

(56) References Cited

U.S. PATENT DOCUMENTS

| | | | |
|---|---|---|---|
| 2007/0281176 A1* | 12/2007 | Palumbo | C23C 24/04 473/578 |
| 2009/0241352 A1 | 10/2009 | Sueda et al. | |
| 2012/0276403 A1* | 11/2012 | Nakagawa | H01L 23/3735 205/50 |
| 2021/0109575 A1* | 4/2021 | Yang | G06F 1/203 |

FOREIGN PATENT DOCUMENTS

| | | |
|---|---|---|
| CN | 104733399 A | 6/2015 |
| CN | 106688092 A | 5/2017 |
| CN | 110653370 A | 1/2020 |
| CN | 210072444 U | 2/2020 |
| JP | 2005183942 A | 7/2005 |
| WO | 2012147610 A1 | 11/2012 |
| WO | 2020083276 A1 | 4/2020 |

OTHER PUBLICATIONS

Tsai C et al: "Metal Reinforced Diamond Composite Films", Materials Research Society Symposium Proceedings; [Materials Research Society Symposium Proceedings], Materials Research Society, Pittsburg, PA; US, vol. 239, Jan. 1, 1992 (Jan. 1, 1992), pp. 275-280, XP000575724.

Hung C C et al: "Tribological studies of electroless nickel/diamond composite coatings on steels", Diamond and Related Materials, Elsevier Science Publishers, Amsterdam, NL, vol. 17, No. 4-5, Apr. 1, 2008 (Apr. 1, 2008), pp. 853-859, XP022633080.

Ramesham R et al:"Selective diamond seed deposition using electroplated copper", Diamond and Related Materials, Elsevier Science Publishers, Amsterdam, NL, vol. 1, No. 8, Jun. 25, 1992 (Jun. 25, 1992), pp. 907-910, XP022741098.

Sikder A K; Misra D S; Singhbal D; Chakravorty S: "Surface engineering of metal-diamond composite coatings on steel substrates using chemical vapour deposition and electroplating routes", Surface and Coatings Technology, vol. 114, No. 2-3, May 12, 1999 (May 12, 1999), pp. 230-234, XP009548169.

European Search Report for Application No. 21859717 dated Oct. 9, 2023, 22 pages.

Wang Xiaoli et al: "Preparation and investigation of diamond-incorporated copper coatings on a brasssubstrate by composite electrodeposition", Surface and Coatings Technology, Elsevier, NL, vol. 386, Feb. 22, 2020 (Feb. 22, 2020), XP086080733.

Chinese Office Action for Application No. 202010864702 dated Apr. 30, 2024, 11 pages.

Extended European Search Report for Application No. 21859717.7 dated Mar. 12, 2024, 29 pages.

PCT International Search Report for Application No. PCT/CN2021/095317 dated May 21, 2021, 11 pages.

\* cited by examiner

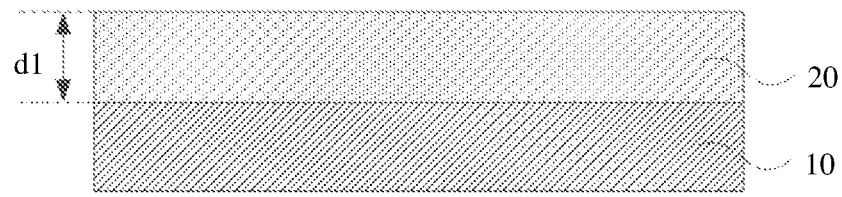
FIG. 1
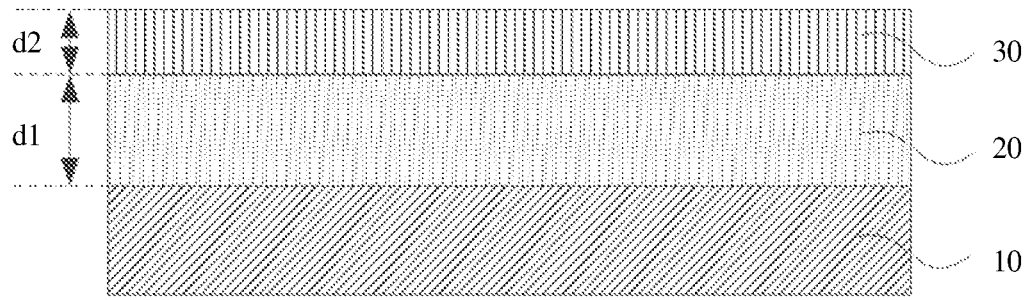
FIG. 2
```
Provide at least a first metal material and a first
composite material, where the first metal material is
used as a first material layer, and the first composite
material is used as a second material layer.                S101
Connect the first material layer and the second material
        layer to form a laminated composite material        S102
```
FIG. 3

ELECTRONIC DEVICE, ROTATING SHAFT, LAMINATED COMPOSITE MATERIAL, AND METHOD FOR MANUFACTURING LAMINATED COMPOSITE MATERIAL

CROSS-REFERENCE TO RELATED APPLICATIONS

This application is a continuation of International Application No. PCT/CN2021/095317, filed on May 21, 2021, which claims priority to Chinese Patent Application No. 202010864702.X, filed on Aug. 25, 2020. The disclosures of the aforementioned applications are hereby incorporated by reference in their entireties.

TECHNICAL FIELD

Embodiments of this application relate to the field of terminal technologies, and in particular, to an electronic device, a rotating shaft, a laminated composite material, and a method for manufacturing a laminated composite material.

BACKGROUND

Electronic devices such as a mobile phone and a computer have become inseparable from our lives and are visible everywhere in our lives, and greatly improve people's living standards. With the rapid development of the communications device technology, electronic products such as a notebook computer, a mobile phone with a foldable screen, and a tablet computer gradually have more functions, and energy consumption increases accordingly. A consumer imposes an increasingly high requirement for performance of the electronic product, and the problem of heat dissipation is a key factor related to performance of the electronic product. Therefore, the heat dissipation problem of the electronic product becomes increasingly more serious. Some manufacturers consider adding a heat conduction function to a rotating shaft of the electronic product to reduce a temperature in a heating region such as a chip region of a host of the electronic product, to balance heat conduction, thereby benefiting an overall heat dissipation effect of the electronic product.

Using a notebook computer as an example, a rotating shaft of the notebook computer includes a fixing member and a rotating member rotatably connected to the fixing member, and the rotating member is configured to connect to a display screen and a computer base of the notebook computer, to fold and unfold the notebook computer. In the conventional technology, the fixing member and the rotating member in the rotating shaft are usually made of aluminum alloy or copper alloy.

However, because friction and heat are generated due to mutual contact between the rotating member and the fixing member when the rotating member rotates around the fixing member, anti-dropping performance, wear-resistant performance, and heat conduction performance of the rotating shaft are relatively poor. Due to relatively poor anti-dropping performance and wear-resistant performance, the entire notebook computer is prone to be worn, loosened, or even broken during rotation, and due to relatively poor heat conduction performance, an overall heat dissipation effect of the notebook computer is not good. Consequently, an experience effect of the notebook computer is affected to a large extent.

SUMMARY

This application provides an electronic device, a rotating shaft, a laminated composite material, and a method for manufacturing a laminated composite material, to improve heat conduction performance and heat dissipation performance of a rotating shaft while ensuring fracture-resistant performance and wear-resistant performance of the rotating shaft, thereby improving user experience.

A first aspect of this application provides a laminated composite material, including at least two material layers that are laminated. The at least two material layers include a first material layer and a second material layer adjacent to each other. The first material layer uses a first metal material, yield strength of the first metal material is greater than 200 Mpa, and an elongation rate of the first metal material is greater than 6%. The second material layer uses a first composite material, and the first composite material includes a second metal material and diamond particles.

The laminated composite material provided in this embodiment of this application includes at least two material layers that are laminated. The first material layer in the at least two material layers uses the first metal material, the yield strength of the first metal material is greater than 200 Mpa, and the elongation rate of the first metal material is greater than 6%, so that strength and fracture-resistant performance of the laminated composite material can be ensured. The second material layer in the at least two material layers uses the first composite material, and the first composite material includes the second metal material and the diamond particles, so that wear-resistant performance, heat conduction performance, and heat dissipation performance of the laminated composite material can be ensured.

In a possible implementation, at least a part of the diamond particles are located on a surface that is of the second material layer and that is away from the first material layer. In this way, at least a part of the second material layer is located on the surface that is of the second material layer and that is not in contact with the first material layer, so that wear-resistant performance, heat conduction performance, and heat dissipation performance of a surface of the laminated composite material can be ensured.

In a possible implementation, the laminated composite material further includes a third material layer attached to the second material layer. The second material layer is disposed between the first material layer and the third material layer, and the third material layer is made of diamond. The diamond has relatively good wear-resistant performance and heat conduction performance, and the diamond is attached to the second material layer and is located on the surface that is of the second material layer and that is away from the first material layer, so that wear-resistant performance, heat conduction performance, and heat dissipation performance of the surface of the laminated composite material can be ensured. In addition, due to padding of the first material layer and the second material layer, it is more advantageous for the diamond in the third material layer to implement extreme heat conduction and extreme hardness.

In a possible implementation, a surface that is of the third material layer and that is away from the second material layer is exposed. In this way, the third material layer is located on an outermost layer of the laminated composite material, which helps further implement extreme heat conduction and extreme hardness of the laminated composite material.

In a possible implementation, a primary element of the first metal material is the same as that of the second metal material, and the primary element is an element that occupies a maximum proportion in the first metal material and the second metal material. In this way, an element occupying a maximum proportion in the first metal material is the same as an element occupying a maximum proportion in the second metal material, so that it can be ensured that the first metal material and the second metal material are more tightly connected.

In a possible implementation, the first metal material includes one of copper alloy and pure copper, and the second metal material includes one of copper alloy and pure copper. The copper alloy and the pure copper have relatively good strength and a relatively high elongation rate, so that strength and fracture-resistant performance of the laminated composite material can be ensured. In a possible implementation, the first metal material includes one of stainless steel and alloy steel, and the second metal material includes one of stainless steel and alloy steel. The stainless steel and the alloy steel have better yield strength and a higher elongation rate, so that strength and fracture-resistant performance of the laminated composite material can be further improved.

In a possible implementation, the first composite material further includes molybdenum sulfide particles. Molybdenum sulfide is a lubricating material and has a self-lubricating effect, so that it can be ensured that the laminated composite material has a specific lubricating attribute while being wear-resistant. In addition, the molybdenum sulfide can further fill a low recessed region together with copper during friction.

In a possible implementation, an average particle size of the molybdenum sulfide particle is less than 15 um. The average particle size of the molybdenum sulfide particle is less than 15 um, so that uniformity of mixed materials in the first composite material can be ensured.

In a possible implementation, an average particle size of the diamond particle is less than 10 um. The average particle size of the diamond particle is less than 10 um, so that uniformity of mixed materials in the first composite material can be ensured.

In a possible implementation, a volume fraction of the diamond particle in the first composite material is greater than or equal to 5%. The volume fraction of the diamond particle is greater than or equal to 5%, so that a proportion occupied by the diamond particle in the first composite material can ensure hardness, wear-resistant performance, a heat conduction effect, and a heat transfer effect of the second material layer.

In a possible implementation, the volume fraction of the diamond particle in the first composite material is greater than or equal to 25%. The volume fraction of the diamond particle is increased to increase the proportion occupied by the diamond particle in the second composite material, so that hardness, wear-resistant performance, a heat conduction effect, and a heat transfer effect of the second material layer can be further improved.

In a possible implementation, a metal injection molding process is performed to form the first material layer and the second material layer of the laminated composite material. The laminated composite material is formed by using the metal injection molding process, so that the first material layer and the second material layer can be formed in a densified manner.

In a possible implementation, a thickness of the second material layer is greater than 0.1 mm. The thickness of the second material layer is greater than 0.1 mm, so that hardness, wear-resistant performance, a heat conduction effect, and a heat transfer effect of the second material layer can be ensured.

In a possible implementation, a thickness of the third material layer is less than 10 um. The thickness of the third material layer is less than 10 um, which can help implement an extreme heat conduction effect of the laminated composite material.

A second aspect of this application provides another laminated composite material, including at least two material layers that are laminated. The at least two material layers include a first material layer and a second material layer adjacent to each other. The first material layer uses a first metal material, yield strength of the first metal material is greater than 200 Mpa, and an elongation rate of the first metal material is greater than 6%. The second material layer uses a first composite material, and the first composite material includes a second metal material and carbide particles.

The laminated composite material provided in this embodiment of this application includes at least two material layers that are laminated. The first material layer in the at least two material layers uses the first metal material, the yield strength of the first metal material is greater than 200 Mpa, and the elongation rate of the first metal material is greater than 6%, so that strength and fracture-resistant performance of the laminated composite material can be ensured. The second material layer in the at least two material layers uses the first composite material, and the first composite material includes the second metal material and the carbide particles, so that wear-resistant performance of the laminated composite material can be ensured.

In a possible implementation, at least a part of the carbide particles are located on a surface that is of the second material layer and that is away from the first material layer. In this way, at least a part of the second material layer is located on the surface that is of the second material layer and that is not in contact with the first material layer, so that wear-resistant performance of a surface of the laminated composite material can be ensured.

In a possible implementation, the laminated composite material further includes a third material layer attached to the second material layer. The second material layer is disposed between the first material layer and the third material layer, and the third material layer is made of carbides. The carbide has relatively good wear-resistant performance, and the carbide is attached to the second material layer and is located on the surface that is of the second material layer and that is away from the first material layer, so that wear-resistant performance of the surface of the laminated composite material can be ensured. In addition, due to padding of the first material layer and the second material layer, it is advantageous for the carbide in the third material layer to implement extreme hardness.

In a possible implementation, a surface that is of the third material layer and that is away from the second material layer is exposed. In this way, the third material layer is located on an outermost layer of the laminated composite material, which helps further implement extreme hardness of the laminated composite material.

In a possible implementation, a primary element of the first metal material is the same as that of the second metal material, and the primary element is an element that occupies a maximum proportion in the first metal material and the second metal material. In this way, an element occupying a maximum proportion in the first metal material is the same as an element occupying a maximum proportion in the second metal material, so that it can be ensured that the first metal material and the second metal material are more tightly connected.

In a possible implementation, the first metal material includes one of copper alloy and pure copper, and the second metal material includes one of copper alloy and pure copper. The copper alloy and the pure copper have relatively good strength and a relatively high elongation rate, so that strength and fracture-resistant performance of the laminated composite material can be ensured.

In a possible implementation, the first metal material includes one of stainless steel and alloy steel, and the second metal material includes one of stainless steel and alloy steel. The stainless steel and the alloy steel have better yield strength and a higher elongation rate, so that strength and fracture-resistant performance of the laminated composite material can be further improved.

In a possible implementation, the first composite material further includes molybdenum sulfide particles. Molybdenum sulfide is a lubricating material and has a self-lubricating effect, so that it can be ensured that the laminated composite material has a specific lubricating attribute while being wear-resistant. In addition, the molybdenum sulfide can further fill a low recessed region together with copper during friction.

In a possible implementation, an average particle size of the molybdenum sulfide particle is less than 15 um. The average particle size of the molybdenum sulfide particle is less than 15 um, so that uniformity of mixed materials in the first composite material can be ensured.

In a possible implementation, an average particle size of the carbide particle is less than 10 um. The average particle size of the carbide particle is less than 10 um, so that uniformity of mixed materials in the first composite material can be ensured.

In a possible implementation, a volume fraction of the carbide particle in the first composite material is greater than or equal to 5%. The volume fraction of the carbide particle is greater than or equal to 5%, so that a proportion occupied by the carbide particle in the second composite material can ensure hardness and wear-resistant performance of the second material layer.

In a possible implementation, the volume fraction of the carbide particle in the first composite material is greater than or equal to 25%. The volume fraction of the carbide particle is increased to increase the proportion occupied by the diamond particle in the second composite material, so that hardness and wear-resistant performance of the second material layer can be further improved.

In a possible implementation, a metal injection molding process is performed between the first material layer and the second material layer to form the laminated composite material. The laminated composite material is formed by using the metal injection molding process, so that the first material layer and the second material layer can be formed in a densified manner.

In a possible implementation, a thickness of the second material layer is greater than 0.1 mm. The thickness of the second material layer is greater than 0.1 mm, so that hardness and wear-resistant performance of the second material layer can be ensured.

A third aspect of the embodiments of this application provides a rotating shaft, including a fixing member and a rotating member rotatably connected to the fixing member. Either of the rotating member and the fixing member or both the rotating member and the fixing member are made of the laminated composite material according to any of the foregoing implementations.

The rotating shaft provided in this embodiment of this application uses the foregoing laminated composite material, so that the rotating shaft has an increased coefficient of heat conductivity compared with a rotating shaft in the conventional technology, and can further achieve a heat dissipation effect and a heat conduction effect while bearing force and rotating.

A fourth aspect of the embodiments of this application provides an electronic device, including at least the rotating shaft described above.

The electronic device provided in this embodiment of this application is provided with the foregoing rotating shaft. Therefore, compared with that a rotating shaft in the electronic device in the conventional technology has an extremely low coefficient of heat conductivity, and can only bear force and rotate but achieve no heat dissipation effect, in this embodiment of this application, an experience effect of the electronic device is optimized. In addition, stability of signal transmission in the electronic device can be ensured, thereby ensuring normal working of the electronic device.

A fifth aspect of the embodiments of this application provides a method for manufacturing a laminated composite material, including: providing at least a first metal material and a first composite material, where the first metal material is used as a first material layer, yield strength of the first metal material is greater than 200 Mpa, and an elongation rate of the first metal material is greater than 6%; and the first composite material is used as a second material layer, and the first composite material includes a second metal material and diamond particles; and connecting the first material layer and the second material layer to form the laminated composite material.

According to the method for manufacturing a laminated composite material provided in this embodiment of this application, the first material layer using the first metal material and the second material layer using the first composite material are connected to form the laminated composite material. The yield strength of the first metal material is greater than 200 Mpa, and the elongation rate of the first metal material is greater than 6%, so that strength and fracture-resistant performance of the laminated composite material can be ensured. The first composite material includes the second metal material and the diamond particles, so that wear-resistant performance, heat conduction performance, and heat dissipation performance of the laminated composite material can be ensured.

In a possible implementation, the connecting the first material layer and the second material layer to form the laminated composite material specifically includes: connecting the first material layer and the second material layer by using a metal injection molding process to form the laminated composite material. The laminated composite material is formed by using the metal injection molding process, so that the first material layer and the second material layer can be formed in a densified manner.

In a possible implementation, after the connecting the first material layer and the second material layer to form the laminated composite material, the method further includes: providing diamond, where the diamond is used as a third material layer; and disposing the third material layer between the second material layer and the first material layer in the laminated composite material, where the third material layer is adjacent to the second material layer.

The third material layer is disposed, the diamond in the third material layer has relatively good wear-resistant performance and heat conduction performance, and the diamond is attached to the second material layer and is located on a surface that is of the second material layer and that is away from the first material layer, so that wear-resistant performance, heat conduction performance, and heat dissipation performance of a surface of the laminated composite material can be ensured. In addition, due to padding of the first material layer and the second material layer, it is advantageous for the diamond in the third material layer to implement extreme heat conduction and extreme hardness.

BRIEF DESCRIPTION OF DRAWINGS

FIG. 1 is a schematic diagram of a structure of a laminated composite material according to an embodiment of this application;

FIG. 2 is a schematic diagram of another structure of a laminated composite material according to an embodiment of this application;

FIG. 3 is a schematic flowchart of a method for manufacturing a laminated composite material according to an embodiment of this application;

DESCRIPTIONS OF REFERENCE NUMERALS

Figure 4:
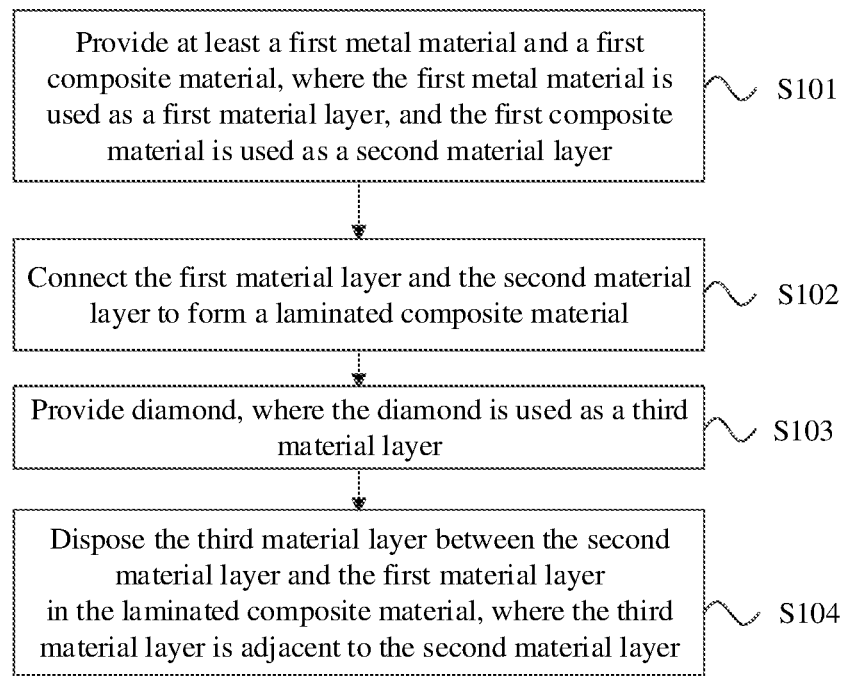
FIG. 4 is a schematic diagram of another structure of a method for manufacturing a laminated composite material according to an embodiment of this application.

100—electronic device; 1—rotating shaft; 101—fixing member; 102—rotating member; 2—first structural member; 3—second structural member; 10—first material layer; 20—second material layer; and 30—third material layer.

DESCRIPTION OF EMBODIMENTS

Some terms used in implementations of this application are merely used for explaining specific embodiments of this application and are not intended to limit this application. Implementations of the embodiments of this application are described in detail below with reference to the accompanying drawings.

As shown in FIG. 1, an embodiment of this application provides a laminated composite material, which may include at least two material layers (that is, a first material layer 10 and a second material layer 20 in FIG. 1, where the second material layer 20 is disposed adjacent to the first material layer 10) that are laminated. The first material layer 10 in the at least two material layers may use a first metal material. Yield strength of the first metal material may be greater than 200 MPa, and an elongation rate of the first metal material may be greater than 6%. In this way, the high yield strength and the high elongation rate of the first metal material can ensure anti-dropping performance and fracture-resistant performance of the laminated composite material.

The second material layer 20 in the at least two material layers may use a first composite material. The first composite material includes a second metal material and diamond particles. In this way, wear-resistant performance, heat conduction performance, and heat dissipation performance of the laminated composite material can be improved. A coefficient of heat conductivity of the first composite material may be greater than 300 W/m.k. For example, the coefficient of heat conductivity of the first composite material may be 350 W/m.k, 400 W/m.k, 450 W/m.k, or the like.

In this embodiment of this application, at least a part of the diamond particles in the first composite material are located on a surface that is of the second material layer 20 and that is away from the first material layer 10. In this way, at least a part of the second material layer 20 is located on the surface that is of the second material layer 20 and that is not in contact with the first material layer 10, so that wear-resistant performance, heat conduction performance, and heat dissipation performance of the laminated composite material can be ensured.

In a possible implementation, Vickers hardness of the first metal material may be greater than 100 HV, and the high Vickers hardness of the first metal material can ensure wear-resistant performance of the laminated composite material.

To further improve anti-dropping performance, fracture-resistant performance, and wear-resistant performance of the first metal material, the yield strength of the first metal material may be greater than 800 Mpa, and the elongation rate of the first metal material may be greater than 9%, and the Vickers hardness of the first metal material may be greater than 305 HV. Similarly, to further improve heat conduction performance and heat dissipation performance of the first composite material, the coefficient of heat conductivity of the first composite material may be greater than 450 W/m.k.

In a possible implementation, a thickness d1 of the second material layer 20 may be greater than 0.1 mm. For example, the thickness d1 of the second material layer 20 may be 0.1 mm, 0.15 mm, 0.2 mm, or the like. The thickness of the second material layer 20 is not limited in this embodiment of this application, and is not limited to the foregoing examples.

In this embodiment of this application, the first metal material may include one of copper alloy and pure copper, that is, the first material layer 10 may use copper that has high strength, a high elongation rate, and high heat conductivity. The copper alloy and the pure copper have relatively good strength and a relatively high elongation rate, so that strength and fracture-resistant performance of the laminated composite material can be ensured. An average particle size of the copper alloy or the pure copper may be less than 30 um, and a copper mass fraction of the copper alloy or the pure copper may be greater than 50%. In this way, strength, mechanical reliability, an elongation rate (anti-dropping and fracture-resistance), and good heat conduction performance of the first material layer 10 can be ensured. Similarly, the second metal material may also include one of copper alloy and pure copper.

Certainly, in some other embodiments, the first metal material may include one of stainless steel and alloy steel, and the second metal material may also include one of stainless steel and alloy steel. This is not limited in this embodiment of this application, and is not limited to the foregoing examples. The stainless steel and the alloy steel have better yield strength and a higher elongation rate, so that strength and fracture-resistant performance of the laminated composite material can be further improved.

In this embodiment of this application, a primary element of the first metal material is the same as that of the second metal material, and the primary element is an element that occupies a maximum proportion in the first metal material and the second metal material. In other words, an element occupying a maximum proportion in the first metal material is the same as an element occupying a maximum proportion in the second metal material, so that it can be ensured that the first metal material and the second metal material are more tightly connected. For example, both the first metal material and the second metal material may include copper alloy, and both the first metal material and the second metal material may include pure copper; or one of the first metal material and the second metal material may include the copper alloy, and the other one of the first metal material and the second metal material may include the pure copper.

In some other embodiments, both the first metal material and the second metal material may include stainless steel, and both the first metal material and the second metal material may include alloy steel; or one of the first metal material and the second metal material may include the stainless steel, and the other one of the first metal material and the second metal material may include the alloy steel.

In addition, it should be noted that composition of the first composite material includes but is not limited to the following two possible implementations.

In one possible implementation, the first composite material is a laminated composite material including the second metal material and diamond particles.

In the other possible implementation, the first composite material is a laminated composite material including the second metal material, diamond particles, and molybdenum sulfide particles.

Molybdenum sulfide is a lubricating material, and the molybdenum sulfide particle has a self-lubricating effect, so that it can be ensured that the laminated composite material has a specific lubricating attribute while being wear-resistant. In addition, the molybdenum sulfide can further fill a low recessed region together with copper during friction.

It should be noted that when the first metal material is the copper alloy, compared with that the first composite material is a laminated composite material including the pure copper, the diamond particles, and the molybdenum sulfide particles, if the first composite material is a laminated composite material including the copper alloy, the diamond particles, and the molybdenum sulfide particles, it can be ensured that a component of the copper alloy in the first material layer 10 is the same as a component of the copper alloy in the second material layer 20, thereby preventing two different materials from causing a slight shrinkage rate difference between the first material layer 10 and the second material layer 20 of the laminated composite material.

Similarly, when the first metal material is the pure copper, compared with that the first composite material is a laminated composite material including the copper alloy, the diamond particles, and the molybdenum sulfide particles, if the first composite material is a laminated composite material including the pure copper, the diamond particles, and the molybdenum sulfide particles, it can be ensured that a component of the pure copper in the first material layer 10 is the same as a component of the pure copper in the second material layer 20, thereby preventing two different materials from causing a slight shrinkage rate difference between the first material layer 10 and the second material layer 20 of the laminated composite material.

In an optional implementation, an average particle size of the pure copper or the copper alloy may be less than 30 um. For example, the average particle size of the pure copper or the copper alloy may be 25 um, 20 um, 15 um, or the like. The average particle size of the pure copper or the copper alloy is not limited in this embodiment of this application, and is not limited to the foregoing examples.

An average particle size of the diamond particle may be less than 10 um. For example, the average particle size of the diamond particle may be 9 um, 8 um, 7 um, or the like. The average particle size of the diamond particle is not limited in this embodiment of this application, and is not limited to the foregoing examples.

An average particle size of the molybdenum sulfide particle may be less than 15 um. For example, the average particle size of the molybdenum sulfide particle may be 10 um, 5 um, 1 um, or the like. The average particle size of the molybdenum sulfide particle is not limited in this embodiment of this application, and is not limited to the foregoing examples.

It should be noted that a volume doping proportion of the diamond particle and that of the molybdenum sulfide particle are from 10% to 30%. A volume doping proportion of diamond may be less than 25%, and a volume doping proportion of molybdenum sulfide may be less than 20%.

In an optional implementation, a volume fraction of the diamond particle in the first composite material may be greater than or equal to 5%. Further, the volume fraction of the diamond particle in the first composite material may be greater than or equal to 25%. In this embodiment of this application, the volume fraction of the diamond particle can be increased to further improve hardness, wear-resistant performance, a heat conduction effect, and a heat transfer effect of the second material layer 20.

In this embodiment of this application, a molding manner used between the first material layer 10 and the second material layer 20 includes but is not limited to the following two possible implementations.

In one possible implementation, a metal injection molding process or a metal pressing molding process may be performed between the first material layer 10 and the second material layer 20 to form the laminated composite material.

It should be noted that metal injection molding (MIM) is a novel powder metallurgy near-net molding technology developed from the plastic injection molding industry. The plastic injection molding technology is used to produce articles of various complex shapes at a low price, but strength of a plastic article is not high. To improve performance of the plastic article, metal or ceramic powder may be added to plastic to obtain an article with high strength and good wear-resistant performance. In recent years, this idea has evolved to increase a content of solid particles to a maximum extent and completely remove a binder and densify a molded blank in a subsequent sintering process. This new powder metallurgy molding method is referred to as metal injection molding.

The first material layer 10 and the second material layer 20 each may have a binder, for example, the binder may be an oil-based binder. The oil-based binder may include paraffin wax and polypropylene, or the oil-based binder may include paraffin wax, polypropylene, and stearic acid. The binder is disposed, so that two adjacent layers of materials (that is, the first material layer 10 and the second material layer 20) have materials whose attributes are consistent, thereby enhancing a degree of molding bonding between the first material layer 10 and the second material layer 20.

In the other possible implementation, a powder pressing molding process may be performed between the first material layer 10 and the second material layer 20 to form the laminated composite material. Powder pressing molding is a powder molding method using externally applied pressure, and is also referred to as powder compression molding. A pressing molding process includes putting in powder, pressing, and demolding.

In still another possible implementation, an insert die-casting molding process may be performed between the first material layer 10 and the second material layer 20 to form the laminated composite material.

In this embodiment of this application, referring to FIG. 2, the at least two material layers may further include a third material layer 30. The third material layer 30 is attached to the second material layer 20, and the second material layer 20 may be disposed between the first material layer 10 and the third material layer 30.

For example, the third material layer 30 may be disposed on the surface that is of the second material layer 20 and that is away from the first material layer 10, one surface of the third material layer 30 is disposed attached to the surface of the second material layer 20, and a surface that is of the third material layer 30 and that is away from the second material layer 20 is exposed, that is, no material is disposed on the surface that is of the third material layer 30 and that is away from the second material layer 20. In this way, the third material layer 30 is located on an outermost layer of the laminated composite material, which can help further ensure wear-resistant performance and heat dissipation performance of the laminated composite material.

In a possible implementation, the third material layer 30 may be formed by using a chemical vapor deposition process on the surface that is of the second material layer 20 and that is away from the first material layer 10.

It should be noted that chemical vapor deposition is a chemical technology, and the technology mainly uses a method in which a thin film is formed on a substrate surface through chemical reaction of one or more vapor-phase compounds or elementary substances that include thin film elements. Chemical vapor deposition is a new technology developed in recent decades for manufacturing an inorganic material, and has been widely used for purifying a substance, developing a new crystal, and depositing various single crystals, polycrystals, or glassy-state inorganic thin film materials. These materials may be oxides, sulfides, nitrides, or carbides, or may be inter-elemental compounds including two or more elements in groups III-V, II-IV, and IV-VI. In addition, physical functions of the materials may be precisely controlled by using a vapor phase doping and deposition process.

In an optional implementation, Vickers hardness of a third material layer may be greater than the Vickers hardness of the first metal material, and a coefficient of heat conductivity of the third material layer 30 may be greater than the coefficient of heat conductivity of the first composite material. In this way, due to padding of the first material layer 10 and the second material layer 20, it is advantageous for the third material layer 30 to implement extreme heat conduction and extreme hardness. In this embodiment of this application, the Vickers hardness of the third material layer 30 may be greater than 4000 HV. For example, the Vickers hardness of the third material layer 30 may be 4500 HV, 5000 HV, 5500 HV, or the like. Certainly, to further improve hardness of the third material layer 30, the Vickers hardness of the third material layer 30 may be greater than 8000 HV.

The coefficient of heat conductivity of the third material layer 30 may be greater than 1000 W/m.k. For example, the coefficient of heat conductivity of the third material layer 30 may be 1500 W/m.k, 2000 W/m.k, 2500 W/m.k, or the like.

In a possible implementation, the third material layer 30 may be made of diamond.

In this embodiment of this application, a thickness d2 of the third material layer 30 may be less than 10 um. For example, the thickness d2 of the third material layer 30 may be 9.5 um, 9 um, 8.5 um, or the like. The thickness of the third material layer 30 is not limited in this embodiment of this application, and is not limited to the foregoing examples.

In some other embodiments, the diamond particles may be replaced with carbide particles. In this way, all functions other than heat conduction performance of the laminated composite material in this embodiment of this application can still be implemented, for example, the carbide particle can still improve wear-resistant performance of the laminated composite material. Certainly, the copper alloy or the pure copper in the first material layer 10 may be replaced with another metal material, such as stainless steel or alloy steel, so that the yield strength of the first material layer 10 can be further improved and anti-dropping performance further improved. However, entire heat conduction performance of the first material layer 10 is greatly reduced. Therefore, the copper alloy or the pure copper is replaced with the material such as the stainless steel or the alloy steel is at the expense of heat conduction performance, and this is suitable for a case in which only heat conduction is required for a surface of the laminated composite material and heat dissipation is not required for the first material layer 10.

It should be noted that in this embodiment of this application, the laminated composite material may include two material layers (the first material layer 10 and the second material layer 20), may include three material layers (the first material layer 10, the second material layer 20, and the third material layer 30), or may include more than three material layers. This is not limited in this embodiment of this application. For example, another material may be disposed below the first material layer 10 (that is, a surface that is of the first material layer 10 and that is away from the second material layer 20) to adapt to different performance, so that the laminated composite material has more performance and advantages.

As shown in FIG. 3, an embodiment of this application further provides a method for manufacturing a laminated composite material, which may include the following steps.

S101: Provide at least a first metal material and a first composite material, where the first metal material is used as a first material layer 10, yield strength of the first metal material is greater than 200 MPa, and an elongation rate of the first metal material is greater than 6%; and the first composite material is used as a second material layer 20, and the first composite material may include a second metal material and diamond particles.

S102: Connect the first material layer 10 and the second material layer 20 to form the laminated composite material.

In an optional implementation, referring to FIG. 4, after S102, the method for manufacturing a laminated composite material provided in this embodiment of this application may further include the following steps.

S103: Provide diamond, where the diamond is used as a third material layer 30.

S104: Dispose the third material layer 30 between the second material layer 20 and the first material layer 10 in the laminated composite material, where the third material layer 30 is adjacent to the second material layer 20.

Specifically, the third material layer 30 may be formed by using a chemical vapor deposition process on a surface that is of the second material layer 20 and that is away from the first material layer 10. For example, a film may be coated on the surface that is of the second material layer 20 and that is away from the first material layer 10 to form a diamond film layer.

It should be noted that the connecting the first material layer 10 and the second material layer 20 to form the laminated composite material may specifically include the following step.

Figure 5:
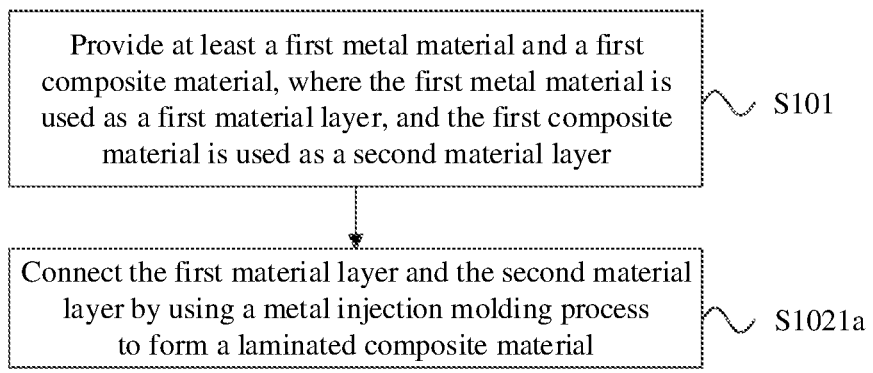
FIG. 5 is a schematic diagram of still another structure of a method for manufacturing a laminated composite material according to an embodiment of this application.

S1021a: Connect the first material layer 10 and the second material layer 20 by using a metal injection molding process to form the laminated composite material (refer to FIG. 5).

Specifically, when the metal injection molding process is used, the first metal material may be mixed with a binder to form a first feed, and the first composite material may be mixed with a binder to form a second feed. Then, the first feed is selected to be injected into the first material layer 10 of the laminated composite material, and the second feed is selected to be injected into the second material layer 20 of the laminated composite material. Because main components (that is, the binders) of the first feed and the second feed are consistent, the first feed and the second feed can be connected to each other. Next, defatting, sintering, and heat treating are sequentially performed on the injected laminated composite material to form the laminated composite material in which the first metal material is the first material layer 10 and the first composite material is the second material layer 20.

In an optional implementation, the binder may be an oil-based binder. The oil-based binder may include paraffin wax and polypropylene, or the oil-based binder may include paraffin wax, polypropylene, and stearic acid. The binder is disposed, so that two adjacent layers of materials (that is, the first material layer 10 and the second material layer 20) have materials whose attributes are consistent, thereby enhancing a degree of molding bonding between the first material layer 10 and the second material layer 20.

Alternatively, the connecting the first material layer 10 and the second material layer 20 to form the laminated composite material may specifically include the following step.

Figure 6:
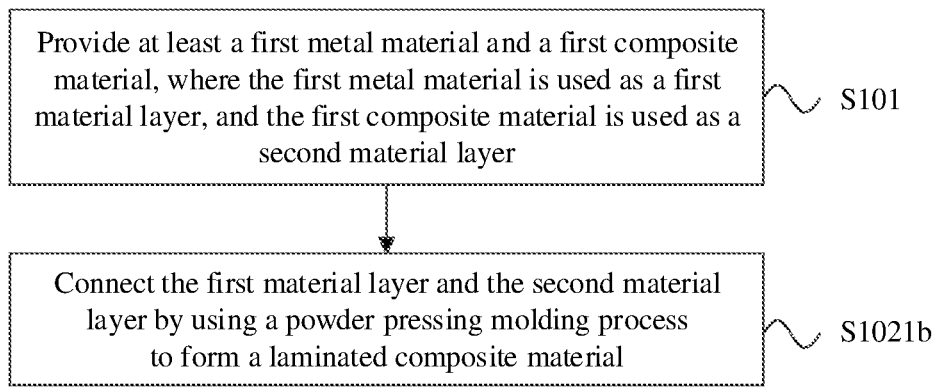
FIG. 6 is a schematic diagram of yet another structure of a method for manufacturing a laminated composite material according to an embodiment of this application.

S1021b: Connect the first material layer 10 and the second material layer 20 by using a powder pressing molding process to form the laminated composite material (refer to FIG. 6).

Alternatively, the connecting the first material layer 10 and the second material layer 20 to form the laminated composite material may specifically include the following step.

Figure 7:
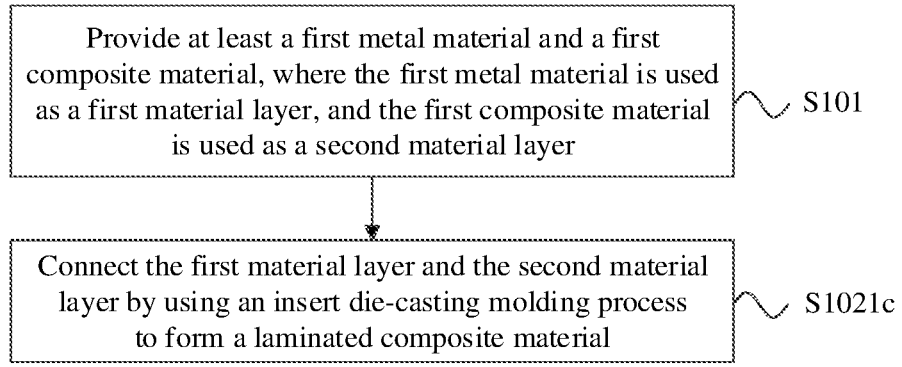
FIG. 7 is a schematic diagram of yet another structure of a method for manufacturing a laminated composite material according to an embodiment of this application.

S1021c: Connect the first material layer 10 and the second material layer 20 by using an insert die-casting molding process to form the laminated composite material (refer to FIG. 7).

Based on the foregoing description, a structure, a material component, and a manufacturing method of the laminated composite material are specifically described below with reference to specific scenarios.

Scenario 1

In this scenario, the laminated composite material may have a two-layer structure. The first metal material used in the first material layer 10 may be copper alloy, and an average granularity value of the copper alloy is less than 20 um. In the first metal material, a weight percentage content of Mn is 28%, a weight percentage content of Ni is 11.7%, a weight percentage content of aluminum is 5%, a weight percentage content of Si is 1.16%, and the remainder includes copper and an impurity whose single element has a weight percentage less than 0.02%.

The first composite material used in the second material layer 20 may be a laminated composite material including pure copper, diamond particles, and molybdenum sulfide particles. An average granularity value of the diamond particle is less than 5 um, and an average granularity value of the molybdenum sulfide particle is less than 10 um. After the pure copper, the diamond particles, and the molybdenum sulfide particles are uniformly mixed, a volume proportion of the diamond particle is less than 5%, and a volume proportion of the molybdenum sulfide particle is less than 10%.

In this scenario, the first material layer 10 and the second material layer 20 are connected by using a metal injection molding process to form the laminated composite material. First, the first metal material is combined with a binder to form a first feed, and the first composite material is combined with a binder to form a second feed (the binders in the first feed and the second feed have a same component). Then, the first feed is selected to be injected into the first material layer 10 of the laminated composite material, and the second feed is selected to be injected into the second material layer 20 of the laminated composite material. Because main components (that is, the binders) of the first feed and the second feed are consistent, the first feed and the second feed can be connected to each other. It should be noted that when injection is performed on the laminated composite material, a single feed injection machine may be used to perform injection twice by changing a feed, or a double feed injection machine may be used to perform injection once.

Further, defatting, sintering, and heat treating are sequentially performed on the injected laminated composite material to form the laminated composite material in which the first metal material is the first material layer 10 and the first composite material is the second material layer 20. Processes of defatting, sintering, and heat treating are separately described below.

Defatting: First, solvent defatting is performed by using $CH_2Cl_2$. The injected laminated composite material is placed in a thermostatic water bath apparatus and is immersed in the thermostatic water bath apparatus. A defatting temperature is 40 degrees Celsius, and defatting time is 3.5 hours. Then, a defatted sample is dried. Further, the defatted sample is placed in a tube furnace for heating, and hydrogen is put into the tube furnace. Thermal defatting time is as follows: A temperature of the tube furnace rises to 200 degrees Celsius at a speed of 2 degrees/min and is kept for 1 hour, then rises to 400 degrees Celsius at a speed of 1.5 degrees/min and is kept for 1 hour, then rises to 430 degrees at a speed of 2 degrees/min and is kept for 1 hour, then rises to 620 degrees at a speed of 2 degrees/min and is kept for 30 minutes, and then rises to 880 degrees Celsius at a speed of 3 degrees/min and is kept for 1 hour, and then the defatted sample is taken out.

Sintering: A sintering furnace is first pre-vacuumized to 0.1 Pa, and then hydrogen is put into the sintering furnace, where an air flow amount is 0.12 cubic meters/hour. A sintering temperature is 1050 degrees Celsius and is kept for 2 hours.

Heat treating: Heat treating is performed on a sintered member. A solid solution temperature is 980 degrees Celsius and is kept for 2 hours, and an aging temperature is 500 degrees Celsius and is kept for 2 hours.

In this scenario, a two-layer structure including the first material layer 10 (the high-strength copper alloy) and the second material layer 20 (the pure copper, the diamond particles, and the molybdenum sulfide particles) is formed. The first material layer 10 ensures strength and an elongation rate of the laminated composite material, and has yield strength of 830 MPa, an elongation rate of 10%, and Vickers hardness of 310 HV. This ensures that a wear-resistant capability is greatly improved while the material is not fractured when falling. The second material layer 20 ensures heat conduction performance, and has a coefficient of heat conductivity greater than 450 W/m.k.

Compared with a laminated composite material in the conventional technology that cannot simultaneously have high strength, high heat conduction performance, and high wear-resistant performance, the laminated composite material in this scenario can effectively integrate the foregoing functions on a same part.

Scenario 2

In this scenario, the laminated composite material may have a three-layer structure. The first metal material used in the first material layer 10 may be copper alloy, and an average granularity value of the copper alloy is less than 25 um. In the first metal material, a weight percentage content of Mn is 25%, a weight percentage content of Ni is 13%, a weight percentage content of aluminum is 4%, a weight percentage content of Si is 1.23%, and the remainder includes copper and an impurity whose single element has a weight percentage less than 0.02%.

The first composite material used in the second material layer 20 may be a laminated composite material including pure copper, diamond particles, and molybdenum sulfide particles. An average granularity value of the diamond particle is less than 5 um, and an average granularity value of the molybdenum sulfide particle is less than 5 um. After the pure copper, the diamond particles, and the molybdenum sulfide particles are uniformly mixed, a volume proportion of the diamond particle is 10%, and a volume proportion of the molybdenum sulfide particle is 10%.

In this scenario, the first material layer 10 and the second material layer 20 are connected by using a metal injection molding process to form the laminated composite material. First, the first metal material is combined with a binder to form a first feed, and the first composite material is combined with a binder to form a second feed (the binders in the first feed and the second feed have a same component). Then, the first feed is selected to be injected into the first material layer 10 of the laminated composite material, and the second feed is selected to be injected into the second material layer 20 of the laminated composite material. Because main components (that is, the binders) of the first feed and the second feed are consistent, the first feed and the second feed can be connected to each other. It should be noted that when injection is performed on the laminated composite material, a single feed injection machine may be used to perform injection twice by changing a feed, or a double feed injection machine may be used to perform injection once.

Further, defatting, sintering, and heat treating are sequentially performed on the injected laminated composite material to form the laminated composite material in which the first metal material is the first material layer 10 and the first composite material is the second material layer 20. Processes of defatting, sintering, and heat treating are separately described below.

Defatting: First, solvent defatting is performed by using $CH_2Cl_2$. The injected laminated composite material is placed in a thermostatic water bath apparatus and is immersed in the thermostatic water bath apparatus. A defatting temperature is 50 degrees Celsius, and defatting time is 3 hours. Then, a defatted sample is dried. Further, the defatted sample is placed in a tube furnace for heating, and hydrogen is put into the tube furnace. Thermal defatting time is as follows: A temperature of the tube furnace rises to 200 degrees Celsius at a speed of 1.5 degrees/min and is kept for 1 hour, then rises to 400 degrees Celsius at a speed of 2 degrees/min and is kept for 1 hour, then rises to 430 degrees at a speed of 2 degrees/min and is kept for 1 hour, then rises to 620 degrees at a speed of 1.5 degrees/min and is kept for 30 minutes, and then rises to 880 degrees Celsius at a speed of 2 degrees/min and is kept for 1 hour, and then the defatted sample is taken out.

Sintering: A sintering furnace is first pre-vacuumized to 0.2 Pa, and then hydrogen is put into the sintering furnace, where an air flow amount is 0.12 cubic meters/hour. A sintering temperature is 1030 degrees Celsius and is kept for 2 hours.

Heat treating: Heat treating is performed on a sintered member. A solid solution temperature is 950 degrees Celsius and is kept for 3 hours, and an aging temperature is 550 degrees Celsius and is kept for 2 hours.

After defatting, sintering, and heat treating are sequentially performed on the injected laminated composite material, the third material layer 30 is disposed on the surface that is of the second material layer 20 and that is away from the first material layer 10 in the laminated composite material. A third material used in the third material layer 30 may be diamond. Specifically, the third material layer 30 may be formed by using a chemical vapor deposition process on the surface that is of the second material layer 20 and that is away from the first material layer 10. To be specific, a film may be coated on the surface that is of the second material layer 20 and that is away from the first material layer 10 to form a diamond film layer. For example, the laminated composite material obtained after heat treating may be placed in a chemical vapor deposition (CVD) furnace to undergo CVD film coating to form a diamond film layer with a thickness of 5 microns.

In this scenario, a three-layer structure including the first material layer 10 (the high-strength copper alloy), the second material layer 20 (the pure copper, the diamond particles, and the molybdenum sulfide particles), and the third material layer 30 (the diamond) is formed. The first material layer 10 ensures strength and an elongation rate of the laminated composite material, and has yield strength of 800 MPa, an elongation rate of 9%, and Vickers hardness of 305 HV. This ensures that a wear-resistant capability is greatly improved while the material is not fractured when falling. The second material layer 20 ensures heat conduction performance, and has a coefficient of heat conductivity greater than 450 W/m.k. The third material layer 30 is a diamond film, and has a coefficient of heat conductivity greater than 1000 W/m.k and Vickers hardness greater than 8000 HV.

Compared with Scenario 1, the laminated composite material in this scenario is manufactured by using three layers of materials, and the third material layer 30 can achieve extreme heat conduction and extreme hardness based on the first material layer 10 and the second material layer 20.

Scenario 3

In this scenario, the laminated composite material may have a three-layer structure. The first metal material used in the first material layer 10 may be copper alloy, and an average granularity value of the copper alloy is less than 25 um. In the first metal material, a weight percent content of Mn is 26%, a weight percent content of Ni is 10%, a weight percent content of aluminum is 5%, a weight percent content of Si is 1.12%, and the remainder includes copper and an impurity whose single element has a weight percentage less than 0.02%.

The first composite material used in the second material layer 20 may be a laminated composite material including pure copper, diamond particles, and molybdenum sulfide particles. An average granularity value of the diamond particle is less than 3 um. After the pure copper, the diamond particles, and the molybdenum sulfide particles are uniformly mixed, a volume proportion of the diamond particle is 25%.

In this scenario, the first material layer 10 and the second material layer 20 are connected by using a metal injection molding process to form the laminated composite material. First, the first metal material is combined with a binder to form a first feed, and the first composite material is combined with a binder to form a second feed (the binders in the first feed and the second feed have a same component). Then, the first feed is selected to be injected into the first material layer 10 of the laminated composite material, and the second feed is selected to be injected into the second material layer 20 of the laminated composite material. Because main components (that is, the binders) of the first feed and the second feed are consistent, the first feed and the second feed can be connected to each other. It should be noted that when injection is performed on the laminated composite material, a single feed injection machine may be used to perform injection twice by changing a feed, or a double feed injection machine may be used to perform injection once.

Further, defatting, sintering, and heat treating are sequentially performed on the injected laminated composite material to form the laminated composite material in which the first metal material is the first material layer 10 and the first composite material is the second material layer 20. Processes of defatting, sintering, and heat treating are separately described below.

Defatting: First, solvent defatting is performed by using $CH_2Cl_2$. The injected laminated composite material is placed in a thermostatic water bath apparatus and is immersed in the thermostatic water bath apparatus. A defatting temperature is 50 degrees Celsius, and defatting time is 3 hours. Then, a defatted sample is dried. Further, the defatted sample is placed in a tube furnace for heating, and hydrogen is put into the tube furnace. Thermal defatting time is as follows: A temperature of the tube furnace rises to 200 degrees Celsius at a speed of 1.5 degrees/min and is kept for 1 hour, then rises to 400 degrees Celsius at a speed of 2 degrees/min and is kept for 1 hour, then rises to 430 degrees at a speed of 1.5 degrees/min and is kept for 1 hour, then rises to 620 degrees at a speed of 1.5 degrees/min and is kept for 30 minutes, and then rises to 880 degrees Celsius at a speed of 2 degrees/min and is kept for 1 hour, and then the defatted sample is taken out.

Sintering: A sintering furnace is first pre-vacuumized to 0.2 Pa, and then hydrogen is put into the sintering furnace, where an air flow amount is 0.12 cubic meters/hour. A sintering temperature is 1030 degrees Celsius and is kept for 2 hours.

Heat treating: Heat treating is performed on a sintered member. A solid solution temperature is 950 degrees Celsius and is kept for 3 hours, and an aging temperature is 550 degrees Celsius and is kept for 2 hours.

After defatting, sintering, and heat treating are sequentially performed on the injected laminated composite material, the third material layer 30 is disposed on the surface that is of the second material layer 20 and that is away from the first material layer 10 in the laminated composite material. A third material used in the third material layer 300 may be diamond. Specifically, the third material layer 30 may be formed by using a chemical vapor deposition process on the surface that is of the second material layer 20 and that is away from the first material layer 10. To be specific, a film may be coated on the surface that is of the second material layer 20 and that is away from the first material layer 10 to form a diamond film layer. For example, the laminated composite material obtained after heat treating may be placed in a chemical vapor deposition (CVD) furnace to undergo CVD film coating to form a diamond film layer with a thickness of 6 microns.

In this scenario, a three-layer structure including the first material layer 10 (the high-strength copper alloy), the second material layer 20 (the pure copper, the diamond particles, and the molybdenum sulfide particles), and the third material layer 30 (the diamond) is formed. The first material layer 10 ensures strength and an elongation rate of the laminated composite material, and has yield strength of 800 MPa, an elongation rate of 9%, and Vickers hardness of 305 HV. This ensures that a wear-resistant capability is greatly improved while the material is not fractured when falling. The second material layer 20 ensures heat conduction performance, and has a coefficient of heat conductivity greater than 450 W/m.k. The third material layer 30 is a diamond film, and has a coefficient of heat conductivity greater than 1000 W/m.k and Vickers hardness greater than 8000 HV.

Compared with Scenario 2, the laminated composite material in this scenario has more diamond particles, to achieve a better heat conduction effect, better hardness, and better wear-resistant performance. In other words, in this scenario, a particle size of the diamond particle is decreased to increase a volume fraction of the diamond particle, and more diamond particles are used as a CVD film, to form a diamond film with better quality.

Scenario 4

In this scenario, the laminated composite material may have a two-layer structure. The first metal material used in the first material layer 10 may be copper alloy, and an average granularity value of the copper alloy is less than 20 um. In the first metal material, a weight percentage content of Mn is 20%, a weight percentage content of Ni is 13%, a weight percentage content of aluminum is 6%, a weight percentage content of Si is 2%, and the remainder includes copper and an impurity whose single element has a weight percentage less than 0.02%.

The first composite material used in the second material layer 20 may be a laminated composite material including copper alloy, diamond particles, and molybdenum sulfide particles. An average granularity value of the diamond particle is less than 5 um, and an average granularity value of the molybdenum sulfide particle is less than 10 um. After the copper alloy, the diamond particles, and the molybdenum sulfide particles are uniformly mixed, a volume proportion of the diamond particle is less than 10%, and a volume proportion of the molybdenum sulfide particle is less than 5%.

In this scenario, the first material layer 10 and the second material layer 20 are connected by using a metal injection molding process to form the laminated composite material.

First, the first metal material is combined with a binder to form a first feed, and the first composite material is combined with a binder to form a second feed (the binders in the first feed and the second feed have a same component). Then, the first feed is selected to be injected into the first material layer 10 of the laminated composite material, and the second feed is selected to be injected into the second material layer 20 of the laminated composite material. Because main components (that is, the binders) of the first feed and the second feed are consistent, the first feed and the second feed can be connected to each other. It should be noted that when injection is performed on the laminated composite material, a single feed injection machine may be used to perform injection twice by changing a feed, or a double feed injection machine may be used to perform injection once.

Further, defatting, sintering, and heat treating are sequentially performed on the injected laminated composite material to form the laminated composite material in which the first metal material is the first material layer 10 and the first composite material is the second material layer 20. Processes of defatting, sintering, and heat treating are separately described below.

Defatting: First, solvent defatting is performed by using $CH_2Cl_2$. The injected laminated composite material is placed in a thermostatic water bath apparatus and is immersed in the thermostatic water bath apparatus. A defatting temperature is 40 degrees Celsius, and defatting time is 3.5 hours. Then, a defatted sample is dried. Further, the defatted sample is placed in a tube furnace for heating, and hydrogen is put into the tube furnace. Thermal defatting time is as follows: A temperature of the tube furnace rises to 200 degrees Celsius at a speed of 2 degrees/min and is kept for 1 hour, then rises to 400 degrees Celsius at a speed of 1.5 degrees/min and is kept for 1 hour, then rises to 430 degrees at a speed of 2 degrees/min and is kept for 1 hour, then rises to 620 degrees at a speed of 2 degrees/min and is kept for 30 minutes, and then rises to 880 degrees Celsius at a speed of 3 degrees/min and is kept for 1 hour, and then the defatted sample is taken out.

Sintering: A sintering furnace is first pre-vacuumized to 0.1 Pa, and then hydrogen is put into the sintering furnace, where an air flow amount is 0.12 cubic meters/hour. A sintering temperature is 1050 degrees Celsius and is kept for 2 hours.

Heat treating: Heat treating is performed on a sintered member. A solid solution temperature is 980 degrees Celsius and is kept for 2 hours, and an aging temperature is 500 degrees Celsius and is kept for 2 hours.

In this scenario, a two-layer structure including the first material layer 10 (the high-strength copper alloy) and the second material layer 20 (the copper alloy, the diamond particles, and the molybdenum sulfide particles) is formed. The first material layer 10 ensures strength and an elongation rate of the laminated composite material, and has yield strength of 830 MPa, an elongation rate of 10%, and Vickers hardness of 310 HV. This ensures that a wear-resistant capability is greatly improved while the material is not fractured when falling. The second material layer 20 ensures heat conduction performance, and has a coefficient of heat conductivity greater than 400 W/m.k.

Compared with Scenario 1, the copper alloy in the first material layer 10 and the copper alloy in the second material layer 20 in the laminated composite material in this scenario have a same component, to prevent two different materials from causing a slight shrinkage rate difference between the first material layer 10 and the second material layer 20 in the laminated composite material.

Scenario 5

In this scenario, the laminated composite material may have a three-layer structure. The first metal material used in the first material layer 10 may be copper alloy, and an average granularity value of the copper alloy is less than 30 um. In the first metal material, a weight percent content of Mn is 22%, a weight percent content of Ni is 16%, a weight percent content of aluminum is 3%, a weight percent content of Si is 1.3%, and the remainder includes copper and an impurity whose single element has a weight percentage less than 0.02%.

The first composite material used in the second material layer 20 may be a laminated composite material including pure copper, diamond particles, and molybdenum sulfide particles. An average granularity value of the diamond particle is less than 5 um, and an average granularity value of the molybdenum sulfide particle is less than 10 um. After the pure copper, the diamond particles, and the molybdenum sulfide particles are uniformly mixed, a volume proportion of the diamond particle is 10%, and a volume proportion of the molybdenum sulfide particle is 10%.

In this scenario, the first material layer 10 and the second material layer 20 are connected by using a powder pressing molding process to form the laminated composite material. First, the first metal material is placed in a pressing mold to undergo pressing molding. Then, the first composite material is placed in the pressing mold to undergo pressing molding.

Further, sintering and heat treating are sequentially performed on the laminated composite material obtained after pressing molding to form the laminated composite material in which the first metal material is the first material layer 10 and the first composite material is the second material layer 20. Processes of sintering and heat treating are separately described below.

Sintering: A sintering furnace is first pre-vacuumized to 0.1 Pa, and then hydrogen is put into the sintering furnace, where an air flow amount is 0.12 cubic meters/hour. A sintering temperature is 1050 degrees Celsius and is kept for 2 hours.

Heat treating: Heat treating is performed on a sintered member. A solid solution temperature is 980 degrees Celsius and is kept for 2 hours, and an aging temperature is 500 degrees Celsius and is kept for 2 hours.

After sintering and heat treating are sequentially performed on the laminated composite material obtained after pressing molding, the third material layer 30 is disposed on the surface that is of the second material layer 20 and that is away from the first material layer 10 in the laminated composite material. A third material used in the third material layer 300 may be diamond. Specifically, the third material layer 30 may be formed by using a chemical vapor deposition process on the surface that is of the second material layer 20 and that is away from the first material layer 10. To be specific, a film may be coated on the surface that is of the second material layer 20 and that is away from the first material layer 10 to form a diamond film layer. For example, the laminated composite material obtained after heat treating may be placed in a chemical vapor deposition (CVD) furnace to undergo CVD film coating to form a diamond film layer with a thickness of 6 microns.

In this scenario, a three-layer structure including the first material layer 10 (the high-strength copper alloy), the second material layer 20 (the pure copper, the diamond particles, and the molybdenum sulfide particles), and the third material layer 30 (the diamond) is formed, so that the laminated composite material in this scenario can simultaneously have attributes such as high strength, high heat conduction performance, and high wear-resistant performance.

Compared with Scenario 2, the laminated composite material in this scenario is manufactured by using the powder pressing molding process.

Scenario 6

In this scenario, the laminated composite material may have a three-layer structure. The first metal material used in the first material layer 10 may be copper alloy. The first composite material used in the second material layer 20 may be a laminated composite material including pure copper, diamond particles, and molybdenum sulfide particles. An average granularity value of the diamond particle is less than 5 um, and an average granularity value of the molybdenum sulfide particle is less than 10 um. After the pure copper, the diamond particles, and the molybdenum sulfide particles are uniformly mixed, a volume proportion of the diamond particle is 10%, and a volume proportion of the molybdenum sulfide particle is 5%.

In this scenario, the first material layer 10 and the second material layer 20 are connected by using an insert die-casting molding process to form the laminated composite material. First, the first composite material is placed in a pressing mold to undergo pressing molding.

Further, sintering and heat treating are sequentially performed on the second material layer 20 obtained after pressing molding. Processes of sintering and heat treating are separately described below.

Sintering: A sintering furnace is first pre-vacuumized to 0.1 Pa, and then hydrogen is put into the sintering furnace, where an air flow amount is 0.12 cubic meters/hour. A sintering temperature is 1050 degrees Celsius and is kept for 2 hours.

Heat treating: Heat treating is performed on a sintered member. A solid solution temperature is 980 degrees Celsius and is kept for 2 hours, and an aging temperature is 500 degrees Celsius and is kept for 2 hours.

After sintering and heat treating are sequentially performed on the second material layer 20 obtained after pressing molding, the second material layer 20 is placed in the pressing mold to undergo insert die-casting, where a die-casting material is the first metal material. In this way, the first material layer 10 and the second material layer 20 can be connected by using the insert die-casting molding process to form the laminated composite material.

Finally, the third material layer 30 is disposed on the surface that is of the second material layer 20 and that is away from the first material layer 10 in the laminated composite material. A third material used in the third material layer 30 may be diamond. Specifically, the third material layer 30 may be formed by using a chemical vapor deposition process on the surface that is of the second material layer 20 and that is away from the first material layer 10. To be specific, a film may be coated on the surface that is of the second material layer 20 and that is away from the first material layer 10 to form a diamond film layer. For example, the laminated composite material obtained after heat treating may be placed in a chemical vapor deposition (CVD) furnace to undergo CVD film coating to form a diamond film layer with a thickness of 6 microns.

In this scenario, a three-layer composite structure including the first material layer 10 (the high-strength copper alloy), the second material layer 20 (the pure copper, the diamond particles, and the molybdenum sulfide particles), and the third material layer 30 (the diamond) is formed, so that the laminated composite material in this scenario can simultaneously have attributes such as high strength, high heat conduction performance, and high wear-resistant performance.

Compared with Scenario 2 and Scenario 5, the laminated composite material in this scenario is manufactured by using the insert die-casting molding process.

It is easily understood that the foregoing several scenarios are merely several examples of a structure, a material component, and a manufacturing method of the laminated composite material in the embodiments of this application. The laminated composite material provided in the embodiments of this application and the method for manufacturing the laminated composite material are not limited to the foregoing examples.

Figure 8:
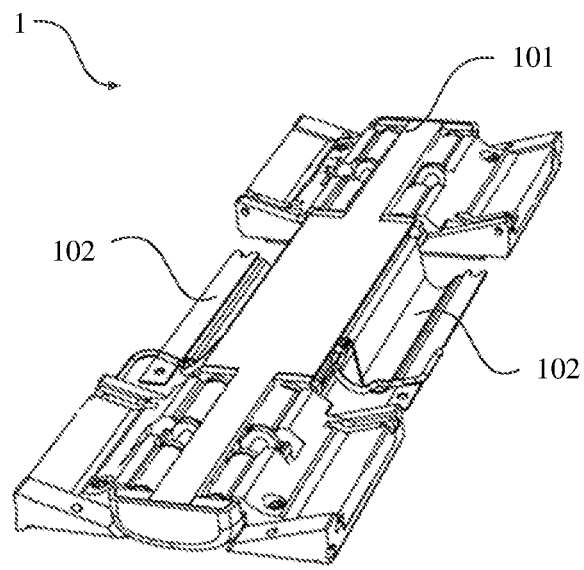
FIG. 8 is a schematic diagram of a structure of a rotating shaft according to an embodiment of this application.

As shown in FIG. 8, an embodiment of this application further provides a rotating shaft 1. The rotating shaft 1 includes a fixing member 101 and a rotating member 102 rotatably connected to the fixing member 101. Either of the rotating member 102 and the fixing member 101 may be made of the laminated composite material in the foregoing first embodiment, or both the rotating member 102 and the fixing member 101 may be made of the laminated composite material in Embodiment 1.

The rotating shaft 1 uses the foregoing laminated composite material, so that the rotating shaft 1 has an increased coefficient of heat conductivity compared with a rotating shaft in the conventional technology, and can further achieve a heat dissipation effect and a heat conduction effect while bearing force and rotating.

It should be noted that the rotating shaft 1 provided in this embodiment of this application may include but is not limited to components such as a rotating shaft of a personal computer (PC), a heat conduction rotating shaft of a personal computer (PC), a rotating shaft of a foldable machine, a heat conduction rotating shaft of a foldable machine, a rotating shaft of a tablet computer, and a heat conduction rotating shaft of a tablet computer.

An embodiment of this application further provides an electronic device 100. The electronic device may include at least the rotating shaft 1 in the foregoing second embodiment, so that the electronic device 100 forms a foldable electronic device.

Figure 9:
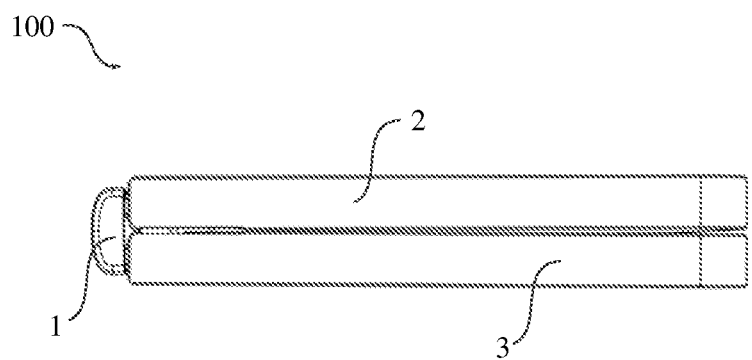
FIG. 9 is a schematic diagram of a structure of an electronic device according to an embodiment of this application.
Figure 10:
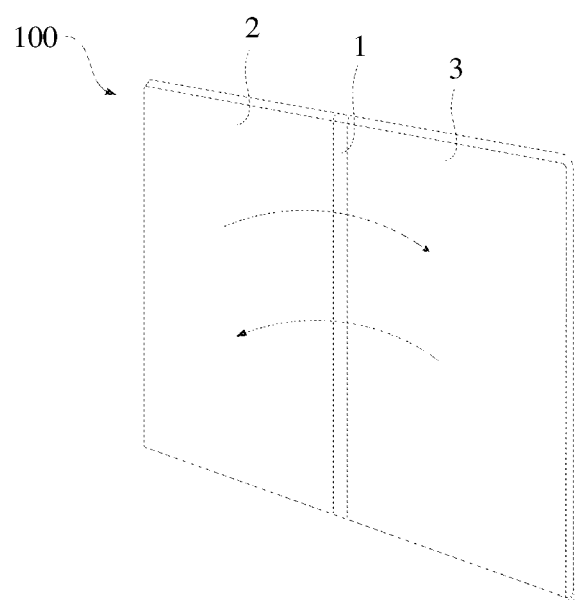
FIG. 10 is a schematic diagram of another structure of an electronic device according to an embodiment of this application.

Referring to FIG. 9, the electronic device 100 may include the rotating shaft 1 and a first structural member 2 and a second structural member 3 that are rotatably connected to the rotating shaft 1. The first structural member 2 and the second structural member 3 are separately rotatably connected to the fixing member 101 through the rotating member 102. In this way, the first structural member 2 and the second structural member 3 can separately rotate around the rotating shaft 1, so that ends that are of the first structural member 2 and the second structural member 3 and that are away from the rotating shaft 1 can be relatively close to each other or relatively far away from each other. Therefore, the electronic device 100 can present different states such as a folded state (refer to FIG. 9) or an unfolded state (refer to FIG. 10).

It should be noted that there may be two or more structural members in the electronic device 100. When there are more than two structural members, every adjacent structural members may rotate around rotation axes 1 that are parallel to each other, thereby forming a multi-layer folding structure, or a larger display area is obtained after unfolding. In this embodiment of this application, an example in which the electronic device 100 has two structural members (that is, the first structural member 2 and the second structural member 3 in FIG. 10) is used for description.

It may be understood that the structure shown in this embodiment of the present invention does not constitute a specific limitation on the electronic device 100. In some other embodiments of this application, the electronic device 100 may include more or fewer parts than those in the figure, or combine some parts, or split some parts, or have different part arrangements. For example, the electronic device 100 further includes a display screen and a rear cover (not shown). The components shown in the figure may be implemented by using hardware, software, or a combination of software and hardware.

The electronic device 100 is provided with the foregoing rotating shaft 1. Therefore, compared with that a rotating shaft in the electronic device 100 in the conventional technology has an extremely low coefficient of heat conductivity, and can only bear force and rotate but achieve no heat dissipation effect, in this embodiment of this application, an experience effect of the electronic device 100 is optimized. In addition, stability of signal transmission in the electronic device 100 is also ensured, thereby ensuring normal working of the electronic device 100.

It should be noted that the electronic device 100 provided in this embodiment of this application may include but is not limited to a mobile terminal or a fixed terminal having the rotating shaft 1, such as a mobile phone, a tablet computer, a notebook computer, a personal computer (PC), a wearable device, and a virtual reality device.

In the description of the embodiments of this application, it should be noted that unless otherwise expressly specified and limited, the terms "install", "connect", and "connection" should be understood in a broad sense, for example, may be a fixed connection, may be an indirect connection through an intermediate medium, or may be communication between two elements or mutual interaction between two elements. A person of ordinary skill in the art may understand specific meanings of the terms in the embodiments of this application based on a specific situation.

The embodiments of this application imply the referred apparatus or imply that the element needs to have a specific direction and be constructed and operated in the specific direction. Therefore, this should not be understood as a limitation on the embodiments of this application. In the description of the embodiments of this application, unless otherwise precisely and specifically specified, "a plurality of" means two or more.

In the specification, claims, and accompanying drawings of embodiments of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that embodiments of this application described herein can be implemented in orders except the order illustrated or described herein. In addition, terms such as "include", "have", and any variations thereof are intended to cover non-exclusive inclusions, for example, a process, method, system, product, or device that includes a series of steps or units is not necessarily limited to those clearly listed steps or units, but may include other steps or units that are not clearly listed or inherent to such a process, method, product, or device.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of the present invention.

What is claimed is:

1. A laminated composite material, comprising:
at least three material layers, wherein
the at least three material layers comprise a first material layer, and a second material layer adjacent to the first material layer, and a third material layer adjacent to the second material layer on a side opposite to the first material layer;
the first material layer comprises a first metal material, wherein yield strength of the first metal material is greater than 200 Mpa, and an elongation rate of the first metal material is greater than 6%; and
the second material layer comprises a first composite material, wherein the first composite material comprises a second metal material and diamond particles, and
wherein the first metal material comprises one stainless steel and alloy steel, the second metal material comprises one of stainless steel and alloy steel, and the third material layer is made of diamond.

2. The laminated composite material according to claim 1, wherein at least a part of the diamond particles are located on a surface of the second material layer on the side opposite the first material layer.

3. The laminated composite material according to claim 1, wherein a surface of the third material layer on the side opposite the second material layer is exposed.

4. The laminated composite material according to claim 1, wherein the first composite material further comprises molybdenum sulfide particles.

5. The laminated composite material according to claim 4, wherein an average particle size of the molybdenum sulfide particle is less than 15 um.

6. The laminated composite material according to claim 1, wherein an average particle size of the diamond particle is less than 10 um and is at least 7 um.

7. The laminated composite material according to claim 1, wherein a volume fraction of the diamond particle in the first composite material is greater than or equal to 5%.

8. The laminated composite material according to claim 7, wherein the volume fraction of the diamond particle in the first composite material is greater than or equal to 25%.

9. The laminated composite material according to claim 1, wherein a metal injection molding process is performed to form the first material layer and the second material layer such that they are adjacent to her and a chemical vapor deposition process is performed to form the third material layer such that the third material layer is adjacent to the second material layer on the side of the second material layer opposite to the first material layer, to form the laminated composite material.

10. The laminated composite material according to claim 1, wherein a thickness of the second material layer is greater than 0.1 mm.

11. The laminated composite material according to claim 10, wherein a thickness of the third material layer is less than 10 um.

12. An electronic device, comprising a rotating shaft comprising a fixing member and a rotating member rotatably connected to the fixing member, wherein either of the rotating member and the fixing member or both the rotating member and the fixing member are made of a laminated composite material, wherein the laminated composite material comprises:

at least three material layers, wherein the at least three material layers comprise a first material layer, and a second material layer adjacent to the first material layer, and a third material layer adjacent to the second material layer on a side opposite to the first material layer;

the first material layer comprises a first metal material, wherein yield strength of the first metal material is greater than 200 Mpa, and an elongation rate of the first metal material is greater than 6%; and the second material layer comprises a first composite material, wherein the first composite material comprises a second metal material and diamond particles, wherein the first metal material comprises one of stainless steel and alloy steel, the second metal material comprises one of stainless steel and steel, and the third material layer is made of diamond.

13. The electronic device according to claim 12, wherein the first composite material further comprises molybdenum sulfide particles.

14. A method for manufacturing a laminated composite material, comprising:

providing at least a first metal material, a first composite material, and a diamond material, wherein a yield strength of the first metal material is greater than 200 Mpa, and an elongation rate of the first metal material is greater than 6%, and wherein the first composite material comprises a second metal material and diamond particles; and forming a first material layer comprising the first metal material, a second material layer comprising the first composite material, and a third material layer comprising the diamond material to form the laminated composite material, wherein the second material layer is adjacent to the first material layer, and the third material layer is adjacent to the second material layer on a side opposite to the first material layer, wherein the first metal material comprises one of stainless steel and alloy steel, the second metal material comprises one of stainless steel and alloy steel, and the diamond material is made of diamond.

15. The laminated composite material according to claim 1, wherein a first process is used to form the first material layer and the second material layer such that they are adjacent to each other, and a second process that is different from the first process is used to form the third material layer such that the third material layer is adjacent to the second material layer on the side of the second material layer opposite the first material layer, to form the laminated composite material.

16. The laminated composite material according to claim 10, wherein a thickness of the third material layer is at least 8.5 μm and less than 10 μm.

17. The electronic device according to claim 12, wherein a first process is used to form the first material layer and the second material layer such that they are adjacent to each other, and a second process that is different from the first process is used to form the third material layer such that the third material layer is adjacent to the second material layer on the side of the second material layer opposite the first material layer, to form the laminated composite material.

* * * * *